United States Patent
Ayers

(10) Patent No.: US 6,277,766 B1
(45) Date of Patent: Aug. 21, 2001

(54) METHOD OF MAKING FULLERENE-DECORATED NANOPARTICLES AND THEIR USE AS A LOW DIELECTRIC CONSTANT MATERIAL FOR SEMICONDUCTOR DEVICES

(76) Inventor: Michael Raymond Ayers, 4100 Alhambra Ave., Martinez, CA (US) 94553

(*) Notice: Subject to any disclaimer, the term of this patent is extended or adjusted under 35 U.S.C. 154(b) by 0 days.

(21) Appl. No.: 09/497,550

(22) Filed: Feb. 3, 2000

(51) Int. Cl.[7] ............... H01L 21/31; H01L 21/469
(52) U.S. Cl. ............... 438/778; 438/622; 438/623; 438/780; 438/781
(58) Field of Search ............... 438/618, 622, 438/623, 624, 778, 780, 781, 787, 789, 790

(56) References Cited

U.S. PATENT DOCUMENTS

| | | |
|---|---|---|
| 4,652,467 | 3/1987 | Brinker et al. . |
| 4,987,101 | 1/1991 | Kaanta et al. . |
| 5,103,288 | 4/1992 | Sakamoto et al. . |
| 5,308,481 * | 5/1994 | Stalling et al. ............... 210/198.2 |
| 5,420,081 * | 5/1995 | Mattes et al. ............... 501/12 |
| 5,470,820 | 11/1995 | Gnade et al. . |
| 5,494,859 | 2/1996 | Kapoor . |
| 5,698,140 | 12/1997 | Lamb et al. . |
| 5,744,399 * | 4/1998 | Rostoker et al. ............... 438/622 |
| 5,801,092 * | 9/1998 | Ayers ............... 438/623 |
| 6,187,427 * | 2/2001 | Taylor-Smith et al. ............... 438/305.5 |

OTHER PUBLICATIONS

Chen, K. et al., J.A.C.S. (1993) 1193–1194, v. 115.

Hirsch, A. et al, Angew. Chem.Int. Ed. Engl. (1991), 1309–1310 v. 30, No. 10.

Wudl, F. et al. "Survey of Chemical Reactivity of C60, Electrophile and Dieno–polarophile Par Excellence" A.C.S. Symposium Series #468 (1992)Chapter 11. A.C.S., Washington, D.C. p. 166–169.

Hirsch, A. et al., "Regioselective Mulitple Additions to Buckminsterfullerene" in The Chemistry and Physics of Fullerenes 10 (and 5) Years Later. Anreoni, W. ed. (1996) p. 267–283, Kluwer Academic Publishers, The Netherlands.

\* cited by examiner

*Primary Examiner*—Matthew Smith
*Assistant Examiner*—Craig P. Lytle

(57) ABSTRACT

This invention provides a process for making an insulation layer for use in microelectronic devices, whereby capacitive coupling and propagation delay in the microelectronic devices are reduced. This invention can include the formation of a stable solution of nanometer-scale particles consisting of an inorganic core 10 that is decorated with a known number of fullerene molecules 20, and including a soluble component that can act to bind the particles together into an integral structure. This solution can be applied to a microelectronic substrate, and dried to form a continuous, porous layer. Porous layers formed by the process of this invention possess a very low dielectric constant, and can be produced using equipment and techniques common and available to those skilled in the art of microelectronic fabrication.

17 Claims, 3 Drawing Sheets

METHOD OF MAKING FULLERENE-DECORATED NANOPARTICLES AND THEIR USE AS A LOW DIELECTRIC CONSTANT MATERIAL FOR SEMICONDUCTOR DEVICES

FIELD OF THE INVENTION

This invention relates generally to the fabrication of dielectric layers on semiconductor devices, and more specifically to methods for forming these from fullerene-decorated nanoparticles that will reduce the line capacitance of integrated circuits, and therefore improve their power consumption and delay time.

BACKGROUND OF THE INVENTION

Microelectronic integrated circuits based on patterned semiconductor materials are continuing to evolve towards devices with an extremely high density of circuit elements per unit volume. As the features of these devices are reduced to smaller sizes, the performance of the various materials that constitute the device will critically determine their success. One specific area in need of advancement is the electrical insulator used between the wires, metal lines, and other elements of the circuit. As the distances between the circuit elements become smaller, there will be increased problems due to capacitive coupling (crosstalk) and propagation delay. These difficulties can be avoided by preparing the circuit using an insulating material that possesses a dielectric constant as low as possible. It has been conventional prior art and practice in this field to use dense materials such as silicon dioxide, silicon nitride, and various organic polymers as insulators. However, the dielectric constants of these materials range from 3.0–7.0, which will not be adequate for future circuits. The success of future circuits will depend on the development of materials with dielectric constants of less that 2.0, and approaching the limiting value of an air gap (1.0). As there are as yet no fully dense materials with a dielectric constant less than 2.0 (2.1 for polytetrafluoroethylene), considerable effort has been focused towards the development of porous dielectric materials. These can be thought of as composite materials, with the value of their dielectric constants being intermediate between that of air and the solid phase.

U.S. Pat. No. 4,987,101, issued to Kaanta, et al. on Jan. 22, 1992 describes a process to prepare fully porous (air gap) structures by depositing a removable material in the critical area of the device, applying a solid cap to this material, and removing the temporary filler through holes bored in the cap. This requires several difficult process steps to completely eliminate all material from the desired areas. Additionally, there would be no mechanical support provided by the air gap. This could lead to deformations of the circuit as the device is cycled through high temperatures in subsequent processing steps.

U.S. Pat. No. 5,103,288 issued to Sakamoto and Hamano on Apr. 7, 1992 describes depositing an intimate mixture of metal oxides on a semiconductor wafer, one or more of which can be removed by chemical means. Extraction of the desired oxide components would leave a porous matrix of the remaining oxide. However, the available oxides that can be easily removed (sodium oxide, calcium oxide, etc.) contain cations that are generally considered to be impurities in semiconductor devices. Furthermore, there is a high probability that there will be incomplete removal of the desired oxide in this process that would adversely affect the dielectric performance of the material.

U.S. Pat. No. 5,494,859 issued to Kapoor on Feb. 27, 1996 describes a process whereby a composite material is deposited on a wafer by chemical vapor methods. This composite contains at least one component that can be removed by themochemical processing, thereby leaving the remaining portion of the composite as a porous layer. This process suffers from the rather expensive vacuum processing equipment needed for deposition of the composite and the high temperatures required to remove the unwanted portion.

A similar approach, taught by Rostoker and Pasch in U.S. Pat. No. 5,744,399 issued on Apr. 28, 1998 involves the formation of a thin layer of a matrix-forming material, filled with fullerene ($C_{60}$, $C_{70}$, etc.) molecules. These fullerenes are subsequently removed by chemical or physical means. Again, this procedure requires the removal of a considerable amount of material from the film to achieve a sufficiently high porosity. This can be very problematic in common integrated circuit processing.

The most common approach taken to achieve porous films on semiconductor wafers draws upon the methods of sol-gel chemistry. These methods typically employ the hydrolysis and condensation reaction of metal or metalloid alkoxides to form a gel containing a continues solid phase of the corresponding metal or metalloid oxide. This gel is filled with the solvent and other liquid reactants used in the process that must be removed to achieve a porous solid matrix. This well-developed process produces porous materials with fine particle sizes (2–10 nm) and very high porosities (70–99%). U.S. Pat. No. 4,652,467 issued to Brinker et al., on Mar. 24, 1987 describes preparing such a gel of silicon oxide. This gel is then dried by evaporative methods yielding a film of pure silicon dioxide. However, there is significant shrinkage resulting from the further condensation reaction of the silica particles as the gel structure is drawn together by the surface tension of the evaporating liquids. This leads to high-density films and increases their dielectric constant. A method to avoid the problem of gel shrinkage during drying has been developed by Gnade, et al, and Cho, et al. and described in U.S. Pat. No. 5,470,802, issued Nov. 28, 1995, and several subsequent patents. This process involves a further chemical derivitization of the silicon dioxide surface with an unreactive organic group. This prevents condensation reactions as the gel shrinks, and allows low-density materials to be prepared by evaporative drying. These sol-gel processes necessitate that several chemical reactions be performed after the alkoxide precursor solution has been applied to the wafer. This leads to difficulties of reproducibility and low throughput. Additionally, as the dielectric constant of porous silicon dioxide varies linearly with porosity (from 3.9 at full density, to 1.0 at full porosity) a very high porosity will be needed to achieve dielectric constants less than 2.0. This fact, and the random nature of the gelation process, increase the likelihood of encountering extremely large pores that would be detrimental to circuit fabrication.

Ayers, in U.S. Pat. No. 5,801,092 issued Sep. 1, 1998, teaches the formation of a dielectric layer prepared from $SiO_2$, nanospheres coated with an organic layer. These spheres are then deposited on a substrate and crosslinked to form an integral film. However, the high temperatures encountered in integrated circuit processing necessitate the use of fluorocarbon materials as the organic component. Fluorine has been found to be highly corrosive to the fine-structured metal elements found in integrated circuits.

Therefore, to provide a low dielectric constant layer with low corrosivity, high thermal stability, and a known, controllable porosity, there is a significant need to develop new organic-inorganic hybrid materials. Additionally, there is a need for such a material that can be easily deposited on semiconductor wafers with standard wafer processing techniques.

An attractive class of molecules for use as the organic component in such a hybrid material is the fullerenes. These are pure carbon molecules with polycyclic cage structures of the formulae $C_{60}$, $C_{70}$, and higher molecular weight analogues. Their unique structure gives the fullerenes many attractive properties, most notably very high thermal stability. Furthermore, fullerenes can be easily combined with various inorganic substances to provide a desirable hybrid material.

SUMMARY OF THE INVENTION

The limitations of the prior art discussed above have, as of yet, not allowed the use of porous materials in semiconductor devices. Several of these limitations are overcome or alleviated by the present invention, which provides a route to the preparation of fullerene-decorated inorganic nanoparticles with improved electrical properties, and methods for their deposition onto semiconductor wafers. In accordance with the present invention, a solution is prepared that contains small particles (preferably less than 30 nm in diameter, and more preferably 2–10 nm in diameter) of a ceramic material (preferably silicon dioxide) that are decorated with a specific number of fullerene molecules (preferably <50% monolayer coverage, and more preferably 5–20% monolayer coverage). Additionally, said solution contains a soluble component that is stable under ordinary conditions, but can be activated by thermal or other physical processes. This component serves to bind the nanoparticles together by reacting with the fullerenes, the inorganic particle, or, preferably, both once activated.

Various possible routes exist to produce high surface area inorganic solids coated with fullerenes. Lamb and Huffman describe in U.S. Pat. No. 5,698,140 issued Dec. 16, 1997, a process for filling a silica, or other inorganic aerogel with fullerenes by chemical vapor deposition. However, in this approach, the fullerenes are not chemically bound to the inorganic phase, but rather, are physisorbed, a situation not favorable to the present invention. Stalling, et al. in U.S. Pat. No. 5,308,481 teach the binding of fullerenes to insoluble bulk silica, for use as column chromatography packing, using various organic coupling agents. Chen, et al. describe a similar process to bind fullerenes to solid substrates using organic coupling agent, and show that the bound fullerenes are capable of undergoing further insertion reactions (*J.A.C.S.*, 115 (1993), 1193–1194.) The present invention also makes use of coupling agents to decorate inorganic nanoparticles with fullerenes. However, it is a critical aspect of this invention that said nanoparticles remain in solution prior to, and subsequent to, fullerene addition.

Said solution of fullerene-decorated nanoparticles and binder is then deposited onto a semiconductor wafer, or other substrate, forming a disordered array of particles with a film porosity ranging from 80% to ~50%. According to the present invention, the deposited spheres are then cured in place, which activates the soluble binder, linking the individual particles and improving the mechanical properties of the layer. This deposit provides an insulating layer with a low dielectric constant (less than 3.0, and preferably less than 2.0). Additionally, this invention provides a method to improve the adhesion of these particles to semiconductor wafers by applying any of various adhesion-promotion agents onto the wafer surface prior to deposition.

A critical feature of the present invention is that the insulating layer produced by the nanoparticle array can be deposited using conventional film deposition techniques without extraordinary chemical processing. A difficulty inherent in depositing films by the sol-gel process arises from the solution-based chemical reactions that must occur after the initial deposition on the substrate. These include the hydrolysis and condensation reactions leading to the formation of the gel, and any further derivitization required to chemically alter the surface of the gel. To achieve reproducible results these reactions must be carried out under precisely controlled conditions and may require long reaction or aging times. A further disadvantage to this process results from the instability of the precursor solutions used for these films. These solutions typically consist of partially condensed silicon alkoxides that are unstable toward further condensation with a concurrent increase in solution viscosity. This will further complicate the deposition of films with a reproducible thickness. The present invention avoids these concerns by performing virtually all solution-based chemical processing prior to the deposition on the wafer.

According to this invention, fullerene-decorated nanoparticles are prepared that exist as monodisperse particles in solutions which are stable indefinitely. These solutions can then be applied to wafers as thin films using standard deposition techniques such as spin coating, spray coating, or dip coating. As solvent evaporates from the film, the nanoparticles deposit onto the wafer surface, with the degree of disorder determining the final porosity of the film. A critical aspect of this invention is that the solution of nanoparticles does not form a gel as drying occurs. Gels are networks of solid particles that entrain large amounts of solvent. Drying of gels commonly leads to cracked films as the evaporating solvent exerts large stresses on the solid network.

A further critical advantage of this invention results from the unique three-dimensional structure of the fullerene used to decorate the inorganic particles. Fullerenes consist of roughly spherical clusters of carbon atoms, the simplest of which, $C_{60}$, has a diameter of approximately 0.8 nm, and a volume of 0.27 $nm^3$. This advantage is apparent in three aspects of film formation using said nanoparticles. The first of these utilizes the many reactive sites of a fullerene molecule to enhance the ability to bind adjacent nanoparticles together. The fullerene $C_{60}$, for example, contains 90 C—C bonds, many of which can serve as reactive sites for a variety of reagents. See Hirsch, et al. *Angew. Chem. Int. Ed. Engl.*, 30, (1991), 1309–1310; Wudl, et al. in *Fullerenes: Synthesis, Properties and Chemistry of Large Carbon Clusters*, ACS Symposium Series 468, (1992), 166–169; and Hirsch, et al. in *The Chemical Physics of Fullerenes 10 (and 5) Years Later*, Kluwer Academic Publishers, (1996), 267–283. Insertion reactions into one or more of the bonds of a fullerene molecule rarely lead to the opening of the closed cage structure of the molecule. The ability to form multiple derivatives while maintaining the integrity of the central cage structure of the fullerene is a major advantage in the present invention, allowing the fullerene to serve as an anchor between adjacent nanoparticles.

The second advantage resulting from the three-dimensional structure of fullerenes is their high thermal stability. Opening the cage structure of a fullerene molecule requires the cleavage of a large number of C—C bonds, an energetically unfavorable situation. In practice, fullerenes are stable at temperatures much higher than those ($\leq 450°$ C.) found in typical integrated circuit manufacturing, subliming without decomposition at 760 Torr and ~530° C. This contributes to the overall high thermal stability of the hybrid organic-inorganic films of the present invention, relative to similar materials containing other, less stable, organic phases.

Yet another advantage resulting from the three-dimensional structure of fullerene molecules is their physical size, which allows them to act as a barrier between adjacent particles. This prevents unwanted consolidation of the inorganic component at high temperatures, which would lead to a concurrent loss of porosity in the film. The mechanism for consolidation and shrinkage of a porous inorganic network involves the thermal condensation reaction of adjacent surface -OH groups. These reactions typically begin at 400° C., and tend to pull adjacent particles together, eventually completely closing any porosity originally present. A fullerene molecule placed and bound at the junction of two adjacent particles will act to prevent their consolidation by virtue of its large size and high thermal stability.

In the present invention, fullerene-decorated inorganic particles are bound together after deposition on a substrate by the action of an additional reactive component present in the precursor solution. Ideally, this component would be highly soluble and stable under ordinary temperatures and other environmental factors. However, this component should also be easily converted to a highly reactive intermediate after the deposition of films of said nanoparticles. Furthermore, to achieve maximum binding ability this component should be difunctional or polyfunctional. Examples of classes of compounds ideal for this purpose are diazides, especially aromatic diazides, diaziridenes, and dioxiranes.

Ideally, this binder will also act to fuse the fullerene-decorated nanoparticles to the substrate. However, with some substrates it may be desirable to employ any of several commonly used adhesion-promotion agents to increase the mechanical strength of the films. It would also be desirable for such an agent to show an affinity for fullerenes to enhance the wetting behavior of said solution. Treating a silicon wafer with phenyltreithoxysilane prior to deposition of the precursor solution is an example of the use of an adhesion-promotion agent.

The above discussed and other features and advantages of the present invention will be apparent to and understood by those skilled in the art from the following detailed description and drawings.

DETAILED DESCRIPTION OF THE PREFERRED EMBODIMENTS

Figure 1A:
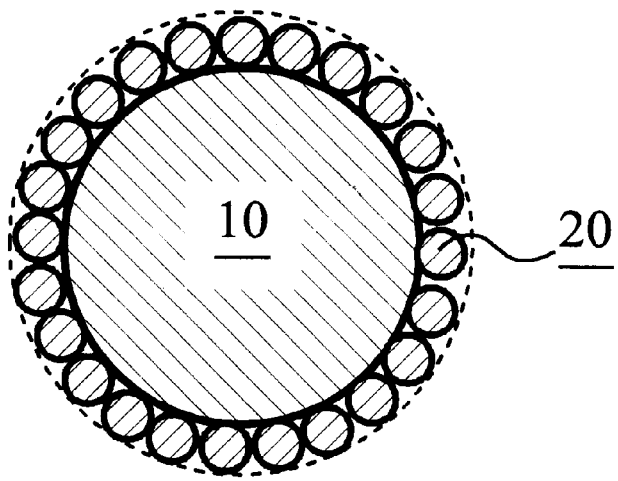
FIGS. 1A–1C show sectional views of particles decorated with three different amounts of fullerenes.

The nanoparticle material of the present invention which is well suited for forming electrical insulating layers in semiconductor integrated circuits comprises a refractory oxide core decorated with a precise amount of fullerene molecules; the nanoparticles prepared in this way having an enhanced surface area, high thermal stability, and high chemical resistance. The nanoparticles prepared according to the present invention are monodisperse and are of a size that allows them to fill the topographical features of a patterned semiconductor wafer. The present invention also teaches methods for improving the adhesion and mechanical properties of the nanoparticles on said wafers by the use of appropriate binders. Any preparative route that produces stable solutions or suspensions of solid particles of an appropriate size may be used, however the preferred method involves the hydrolysis and condensation of a metal or metalloid alkoxide. The preferred particle composition, which can be simply prepared as monodisperse spheres of the appropriate size, is silicon oxide ($SiO_2$). However, any solid composition that possesses certain desirable properties, notably a dielectric constant of 4 or less, and good thermal stability may be employed.

The fullerenes added to the oxide particles serve several purposes; they should; provide a reactive site useful for binding the particles into an integrated unit, prevent undesirable consolidation of said particles thereby maintaining the desired porosity level in films made from said particles, and provide resistance to high temperatures. The preferred materials that meet the above requirements have the formulae $C_{60}$, $C_{70}$, $C_{72}$, $C_{74}$, $C_{76}$, $C_{78}$, $C_{84}$, $C_{96}$, and higher analogues up to, and beyond, $C_{184}$. Additionally, mixtures of any or all of these compounds may be used. These materials are available in commercial-scale quantities from SES Research, Inc. Southern Chemical Group, LLC, and Dynamic Enterprises Ltd. Mixtures commonly known as Fullerite, or Fullerene extract, which typically consist of 70% $C_{60}$, 28% $C_{70}$, and 2% larger analogs, are especially desirable for the present invention due to their lower cost.

In the preferred embodiment of this invention, the oxide cores of the nanoparticles are prepared by the hydrolysis and condensation of an alkoxide, preferably tetramethylorthosilicate, or more preferably, tetraethylorthosilicate (TEOS). The conditions for the hydrolysis and condensation of the alkoxide (namely alkoxide concentration, water content, and pH) are controlled such that the desired particle size of the resultant oxide is achieved and that the particles remain monodisperse and in solution. The solvent system used for the formation of the oxide cores includes an alcohol, preferably ethanol, and a second component in which fullerenes show a high solubility. The preferred co-solvent is toluene, but others such as, xylenes, carbon disulfide, or 1,2-dichlorobenzene may be used as well. Additional solvents may be added that alter the deposition or drying behavior of the mixture. Examples are higher-boiling alcohols, such as benzyl alcohol or tertiary butanol. In the preferred embodiment the volume ratios of the reagents, ethanol, toluene, water, TEOS, 30% aqueous ammonia, and 0.1M $NH_4F$ are; 200.0:100.0:2.38:5.0:0.115:0.115. This results in a stable solution of silica particles with diameters of ~6–7 nm.

Figure 1B:
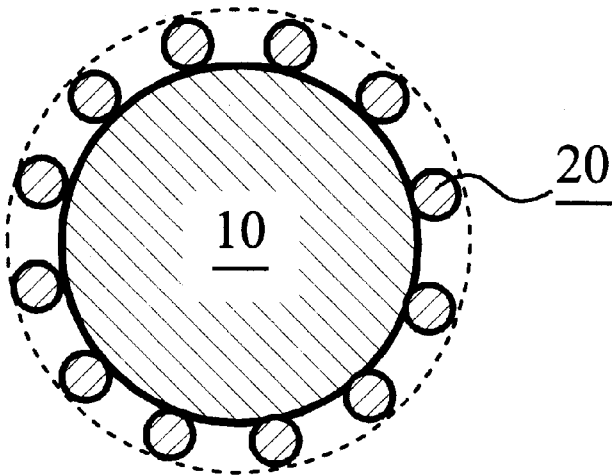
Figure 1C:
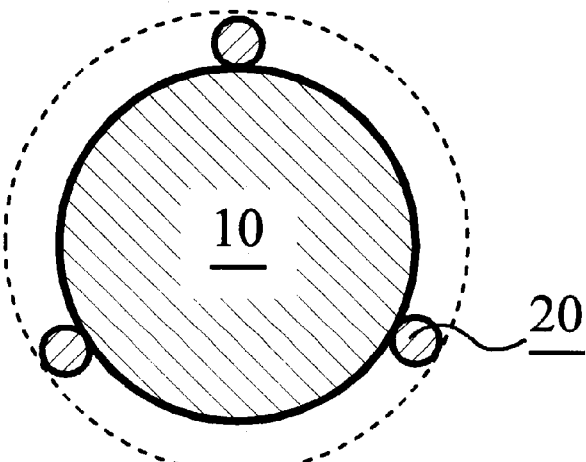
Figure 2A:
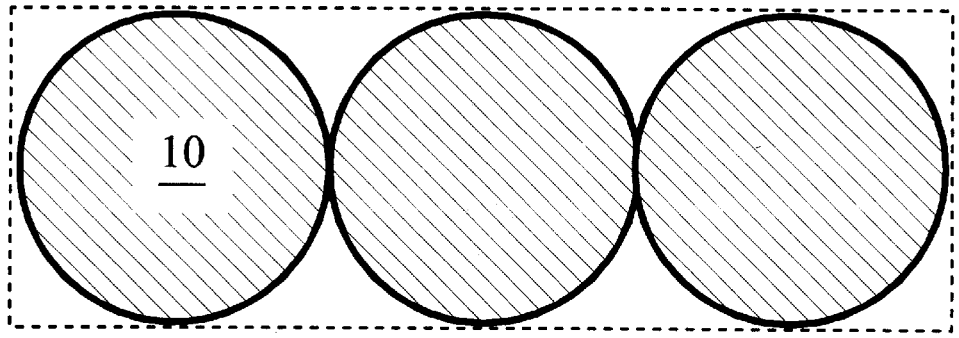
FIGS. 2A–2B show sectional views of three plain particles and three particles decorated with 10% surface coverage of fullerenes and the volume of space occupied in each case.
Figure 2B:
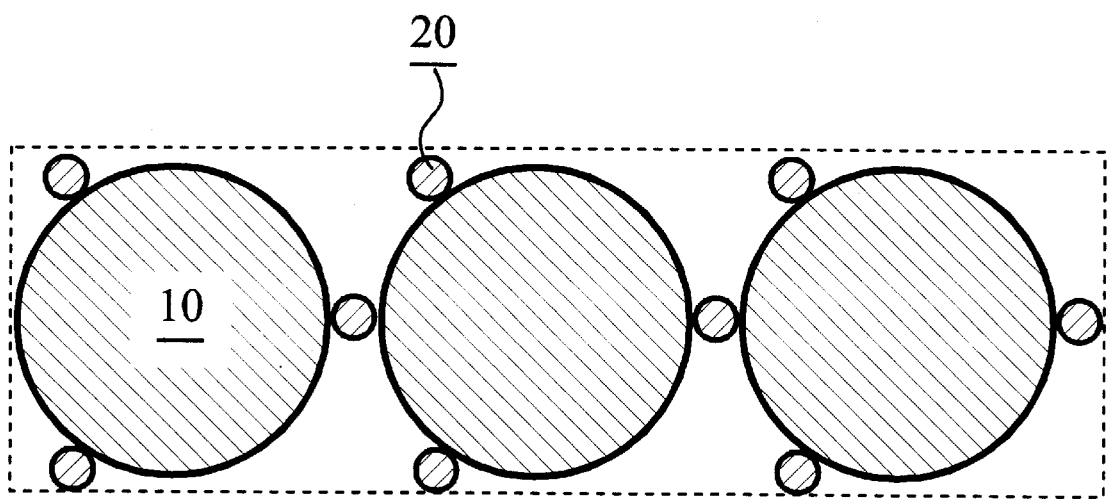

The silica particles thus prepared are then decorated with a specific amount of fullerenes. The exact amount of fullerene used plays a critical role in determining the overall porosity of the final film. FIG. 1A shows a sectional view of an oxide core, 10, with a diameter of 6 nm that has been decorated with the maximum possible amount of fullerenes, 20, equivalent to 100% monolayer coverage. The dashed line shows the effective total occupied volume of the decorated particle, which in this case is 87% of the theoretical maximum. FIG. 1B gives a similar view of a decorated particle with only 50% monolayer coverage of fullerenes. In this case, the effective occupied volume is 68% of the theoretical maximum. A final view is given in FIG. 1C, with 10% monolayer coverage, with an effective occupied volume of 53% of the theoretical maximum. FIG. 2A shows a sectional view of three plain particles with diameters of 6 nm. The dashed line shows the effective occupied volume, with the actual occupied volume being 53% of the theoretical maximum. This is contrasted by FIG. 2B, which shows similar particles decorated with 10% monolayer coverage of fullerenes, with an actual occupied volume of 42% of the theoretical maximum. To provide a film with the lowest possible dielectric constant, the level of fullerenes decorated onto the oxide particles is kept to a minimum value, preferably less than 50%, more preferably less than 25%, and still more preferably 5–15%.

The binding of the fullerenes to the oxide particles is accomplished in the present invention through the use of organic coupling agents. These are small molecules which possess a functional group with a high affinity for fullerenes on one end, and a group which reacts with surface —OH groups on the opposite end. In the present invention, the preferred coupling agent is 3-aminopropyltriethoxysilane. Primary and secondary amines react readily with fullerenes by N—H addition across a C—C bond. Other classes of coupling agents may be used, if desired, such as diamines, dienes, halogenated compounds, or azides. To effect the addition of the fullerene to the oxide surface, a second solution is prepared which consists of a saturated solution of fullerenes in toluene, to which 1 molar equivalent of 3-aminopropyltriethoxysilane is added. After standing for 24 hours, an amount of said solution sufficient to provide the desired level of fullerene coverage is added to the solution of oxide particles.

The final step in the preparation of the precursor solution is the addition of the soluble binder to the solution of decorated nanoparticles. The preferred binder for the present invention is 4,4'-diazidobenzophenone. This compound is stable under ordinary condition, but readily liberates two $N_2$ molecules at elevated (>100° C.) temperature, or upon exposure to ultraviolet, or other high-energy radiation. Upon release of $N_2$, a very highly reactive dinitrene intermediate is formed. These react with any adjacent molecules, especially the fullerenes, which show a high affinity for azide-derived nitrenes. Other similar compounds such as 4,4'-diazidostilbene, 4,4'-diazidodiphenylethane, 4,4'-diazidodiphenylether, 2,6-di-(p-azidobenzal)-cyclohexanone, or 2,6-di-(p-azidobenzal)-4-methylcyclohexanone may be used, as well as other classes of compounds such as diaziridenes or dioxiranes.

In an alternate embodiment of the present invention, the organic coupling agent is added to the oxide nanoparticles prior to reaction with the fullerenes. In this case, a specific amount of 3-aminopropyltriethoxysilane is added directly to a solution of oxide particles prepared as in the above embodiment. The amount added is based on the known surface area of the oxide particles in solution and the desired amount of coverage of fullerenes. After this addition, a saturated solution containing 1 molar equivalent of fullerenes, relevant to the coupling agent, is added to the solution of said nanoparticles.

In yet another embodiment, it may be desirable to derivatize any unreacted —OH groups on the surface of the nanoparticles not decorated with fullerenes with a suitable non-polar group. This may be desirable in cases where the amount of fullerene decoration is low, in order to decrease the absorption of moisture in the final film. This can be easily accomplished by the addition of a small amount of hexamethydisilazane, or other reagent useful for converting —OH to —OR groups to the solution of decorated nanoparticle prepared as in the above embodiments.

The solution of fullerene-decorated nanoparticles prepared according to the above embodiments is then ready for deposition onto the desired substrate. However, when a coating of nanoparticles is desired on a semiconductor wafer, a pretreatment step may be needed. Typical semiconductor wafers possess thin coatings of metal oxides over the silicon, aluminum, tungsten, copper or other metals used in the device. These oxide layers commonly support a large number of hydroxyl groups at the exterior surface. These polar groups may show a low affinity for the fullerene component of the nanoparticles described in this invention. However, this surface is easily modified by simple soaking in, or exposure to vapors of, any of several common reagents, such as hexamethyldisilazane, phenyltriethoxysilane, or chlorotriphenylsilane.

Figure 3:
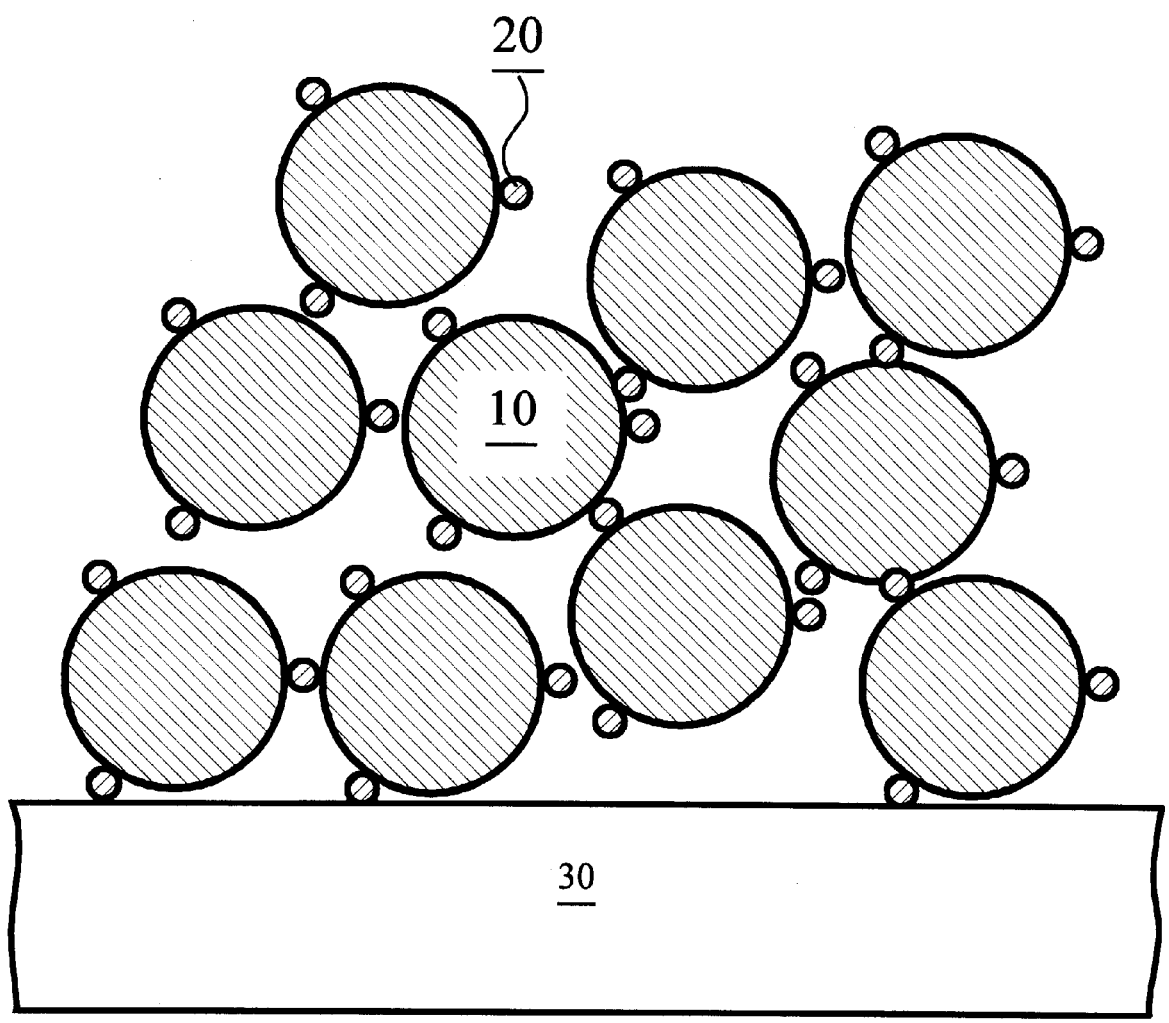
FIG. 3 shows a portion of a film of decorated nanoparticles on a solid substrate.

The solution of nanospheres is then applied to the untreated or treated wafer through any of several methods common to the art, including spin coating, spray coating, or dip coating. Single coatings are preferable, but multiple coatings may be used to achieve a desired film thickness. The deposition method chosen would preferably deposit a dried film with a thickness between 0.1 and 2.0 $\mu$m, and more preferably between 0.5 and 1.5 $\mu$m, and still more preferably between 0.8 and 1.2 $\mu$m. The degree of disorder is affected by the initial concentration of the nanosphere solution, the evaporation rate of the solvents, the temperature of the deposition and other physical variables. The degree of disorder is critical to determining overall porosity and therefore, the final dielectric constant of the layer. FIG. 3 shows a sectional view of a portion of a film formed from fullerene-decorated nanospheres on a solid substrate, 30, (not to scale), the fullerene molecules can be seen to prevent consolidation within the film. The residue from the soluble binder is not visible at the scale shown in FIG. 3.

The final process step in the present invention is the activation of the soluble binder and curing of the deposited film. The preferred method of curing initiates the decomposition of the diazide binder at a temperature between 250 and 450° C. Other methods such as ultraviolet irradiation may be used alone, or in combination with thermal treatments. The preferred atmosphere for the curing step is nitrogen, however any inert atmosphere such as argon or helium may be used as well. The effectiveness of this curing process will be, in part, determined by amount of the soluble binder relative to the fullerene-decorated nanoparticles in the dried film. This may be adjusted up to a maximum level where the addition of further binder begins to fill the porosity of the film, thereby increasing its dielectric constant.

EXAMPLE

The following non-limiting example demonstrates the experimental conditions needed to prepare fullerene-decorated nanoparticles and dielectric films prepared from fullerene-decorated nanoparticles prepared according to the methods described hereinabove.

In the preferred embodiment of this invention, fullerene-decorated silica nanoparticles with a diameter of 6–7 nm, and a specific surface area of 430 $m^2/g$, were prepared by the following procedure. Fullerite (0.055 grams, 70% $C_{60}$, 28% $C_{70}$, 2% higher) was dissolved in 20 mL toluene, 0.020 mL of 3-aminopropyltriethoxysilane was then added and the solution allowed to stand at 25° C. for 24 hours. A second mixture of 130 mL of ethanol, 65 mL toluene, 1.25 mL benzyl alcohol, 3.0 grams of TEOS, 1.55 grams of water, 0.075 mL of 30% aqueous ammonia, and 0.075 mL of 0.1 M aqueous ammonium fluoride was then prepared and stirred at 25° C. for 4 hours. After which, the fullerite solution was filtered, and slowly added to the TEOS solution. The mixture was stirred for 24 hours followed by the addition of 0.115 grams of 4,4'-diazidobenzophenone. Evaporating all solvents from this solution and heating the resulting solids under a nitrogen atmosphere to 450° C. for 10 minutes gave a black solid with a bulk density considerably less than 1 gram per cm$^3$, and with a specific surface area of 430 m$^2$/g (corresponding to a particle diameter of 6.7 nm for spheres with a density of ~2 g/cm$^3$).

A small amount of the solution prepared according to the preferred embodiment described above was coated onto a silicon wafer. Seven mL of said solution of fullerene-decorated nanoparticles was dispensed onto a wafer spinning at 50 rpm. After three seconds, the spin-rate of the wafer was increased to 150 rpm and held at that speed for 60 seconds, leaving a thin film of nanoparticles. The wafer was dried at 60° C. for 30 seconds, and then baked at 450° C. under a nitrogen atmosphere for 10 minutes to permanently cure the film. This results in a highly porous, crack-free film with a thickness of approximately 0.3 $\mu$m and a dielectric constant less than 2.4.

The invention is not to be construed as limited to the particular examples described herein, as these are illustrative rather than restrictive. The invention is intended to cover all processes and structures that do not depart from the spirit and scope of the invention. Specifically the use of individual solid particles with a controllable size that can be decorated with a specific amount of fullerenes and then deposited and cured onto a substrate for use as an electrical insulator.

What is claimed is:

1. A method of forming a porous insulator within a microelectronic device comprising:
   (a) providing a solid substrate possessing a layer of patterned conductors, or onto which said patterns will subsequently be placed;
   (b) providing a solution comprising particles and solvent, wherein said particles consist of a solid core decorated with a known amount of a fullerene;
   (c) adding a soluble component to said particles and solvent, wherein said soluble component serves as a binder;
   (d) depositing a film of said solution onto said substrate such that the gap between any said conductors is filled substantially with said solution;
   (e) drying said film such that said particles form a continuous layer over said substrate; and
   (f) treating the layer such that said binder links adjacent particles and additionally links said particles and said substrate to form a substantially bonded porous dielectric having a dielectric constant less than 3.0, whereby the capacitive coupling and propagation delay of said conductors is substantially reduced compared to solid silicon dioxide, and wherein the sum of the packing density of said particles and the porosity of said layer is equal to one.

2. The method of claim 1, wherein the solid core of said particles consists of silicon dioxide.

3. The method of claim 1, wherein the solid cores of said particles have diameters in the approximate range of 2 to 100 nm.

4. The method of claim 1, wherein said fullerene is $C_{60}$.

5. The method of claim 1, wherein said fullerene is $C_{70}$.

6. The method of claim 1, wherein said fullerene is a mixture of any or all of $C_{60}$, $C_{70}$, $C_{72}$, $C_{74}$, $C_{76}$, $C_{78}$, $C_{84}$, $C_{96}$, $C_{184}$.

7. The method of claim 1, wherein the amount of said fullerene coverage is between 5 and 50% of a monolayer.

8. The method of claim 7, wherein the amount of said fullerene coverage is between 5 and 25% of a monolayer.

9. The method of claim 8, wherein the amount of said fullerene coverage is between 5 and 15% of a monolayer.

10. The method of claim 1, wherein said fullerenes are attached to said solid core by means of an organic coupling agent.

11. The method of claim 1, wherein said fullerene possess a high thermal tolerance, whereby allowing said layers to substantially withstand fabrication temperatures in the approximate range of 300–500° C. encountered in microelectronics production.

12. The method of claim 1, wherein said fullerenes prevent degradation, coagulation, flocculation, or gelation of said particles.

13. The method of claim 1, wherein said fullerene-decorated particles are further reacted with an agent that coats the exposed surface of the ceramic core with non-polar groups.

14. The method of claim 1, wherein said soluble component is a member of a class of compounds selected from the group consisting of diazides, diaziridenes, and dioxiranes.

15. The method of claim 1, wherein said soluble component is selected from the group consisting of, 4,4'-diazidobenzophenone, 4,4'-diazidostilbene, 4,4'-diazidodiphenylethane, 4,4'-diazidodiphenylether, 2,6-di-(p-azidobenzal)cyclohexanone, or 2,6-di-(p-azidobenzal)-4-methylcyclohexanone.

16. The method of claim 1, wherein said treatment is accomplished by methods selected from the group consisting of thermal treatment, electron bombardment, and treatment with electromagnetic radiation, or a combination thereof.

17. The method of claim 1, wherein said substrate is treated with a chemical agent that alters the surface chemistry of the substrate prior to deposition of said solution, whereby the adhesion of said particles to said substrate is substantially enhanced.

* * * * *